United States Patent
Schumaker et al.

(10) Patent No.: US 7,665,981 B2
(45) Date of Patent: Feb. 23, 2010

(54) SYSTEM TO TRANSFER A TEMPLATE TRANSFER BODY BETWEEN A MOTION STAGE AND A DOCKING PLATE

(75) Inventors: Philip D. Schumaker, Austin, TX (US); Angelo Fancello, Austin, TX (US); Jae H. Kim, Austin, TX (US); Byung-Jin Choi, Austin, TX (US); Daniel A. Babbs, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 670 days.

(21) Appl. No.: 11/211,766

(22) Filed: Aug. 25, 2005

(65) Prior Publication Data
US 2007/0071582 A1 Mar. 29, 2007

(51) Int. Cl.
*B29C 59/00* (2006.01)
(52) U.S. Cl. ...................................... 425/385
(58) Field of Classification Search ................. 425/385; 264/293
See application file for complete search history.

(56) References Cited

U.S. PATENT DOCUMENTS

| | | | |
|---|---|---|---|
| 4,512,848 A | 4/1985 | Deckman et al. | |
| 4,610,442 A | 9/1986 | Oku et al. | |
| 4,731,155 A | 3/1988 | Napoli et al. | |
| 4,760,429 A * | 7/1988 | O'Connor | 355/77 |
| 4,763,886 A | 8/1988 | Takei | |
| 4,848,911 A | 7/1989 | Uchida et al. | |
| 4,959,252 A | 9/1990 | Bonnebat et al. | |
| 5,028,366 A | 7/1991 | Harakal et al. | |
| 5,110,514 A | 5/1992 | Soane | |
| 5,148,037 A | 9/1992 | Suda et al. | |
| 5,151,754 A | 9/1992 | Ishibashi et al. | |
| 5,170,182 A | 12/1992 | Olson et al. | |
| 5,180,757 A | 1/1993 | Lucey | |
| 5,240,550 A | 8/1993 | Boehnke et al. | |
| 5,259,926 A | 11/1993 | Kuwabara et al. | |
| 5,302,627 A | 4/1994 | Field et al. | |
| 5,332,013 A | 7/1994 | Sugita et al. | |
| 5,362,940 A | 11/1994 | MacDonald et al. | |

(Continued)

FOREIGN PATENT DOCUMENTS

EP 1 500 980 A1 1/2005

(Continued)

OTHER PUBLICATIONS

PCT/US06/26366 International Search Report, Aug. 14, 2008.

(Continued)

*Primary Examiner*—Maria Veronica D Ewald
(74) *Attorney, Agent, or Firm*—Laura C. Wood

(57) ABSTRACT

The present is directed towards an imprint lithography system including, inter alia, a docking plate; a motion stage having a range of motion associated therewith, the range of motion having a periphery spaced-apart from the docking plate a first distance; and a body, having first and second opposed sides spaced-apart a second distance, selectively coupled between the docking plate and the motion stage, the first distance being greater than the second distance to minimize a probability of a collision between the docking plate, the motion stage and the body while transferring the body between the docking plate and the motion stage.

23 Claims, 9 Drawing Sheets

Fig. 5

U.S. PATENT DOCUMENTS

| Patent No. | Date | Inventor |
|---|---|---|
| 5,371,822 A | 12/1994 | Horwitz et al. |
| 5,417,537 A | 5/1995 | Miller |
| 5,425,848 A | 6/1995 | Haisma et al. |
| 5,480,047 A | 1/1996 | Tanigawa et al. |
| 5,512,131 A | 4/1996 | Kumar et al. |
| 5,545,367 A | 8/1996 | Bae et al. |
| 5,601,641 A | 2/1997 | Stephens |
| 5,669,303 A | 9/1997 | Maracas et al. |
| 5,715,064 A | 2/1998 | Lin |
| 5,726,548 A | 3/1998 | Chiba et al. |
| 5,760,500 A | 6/1998 | Kondo et al. |
| 5,772,905 A | 6/1998 | Chou |
| 5,776,748 A | 7/1998 | Singhvi et al. |
| 5,812,629 A | 9/1998 | Clauser |
| 5,820,769 A | 10/1998 | Chou |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,905,566 A | 5/1999 | Comulada et al. |
| 5,948,470 A | 9/1999 | Harrison et al. |
| 5,956,216 A | 9/1999 | Chou |
| 5,969,441 A | 10/1999 | Loopstra et al. |
| 5,974,150 A | 10/1999 | Kaish et al. |
| 6,046,056 A | 4/2000 | Parce et al. |
| 6,074,827 A | 6/2000 | Nelson et al. |
| 6,180,239 B1 | 1/2001 | Whitesides et al. |
| 6,188,150 B1 | 2/2001 | Spence |
| 6,218,316 B1 | 4/2001 | Marsh |
| 6,262,796 B1 | 7/2001 | Loopstra et al. |
| 6,274,294 B1 | 8/2001 | Hines |
| 6,309,580 B1 | 10/2001 | Chou |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,467,761 B1 | 10/2002 | Amatucci et al. |
| 6,473,157 B2 | 10/2002 | Nakahara |
| 6,482,742 B1 | 11/2002 | Chou |
| 6,498,350 B2 | 12/2002 | Kwan et al. |
| 6,498,640 B1 | 12/2002 | Ziger |
| 6,515,736 B1 | 2/2003 | Hayden et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,580,172 B2 | 6/2003 | Mancini et al. |
| 6,621,960 B2 | 9/2003 | Wang et al. |
| 6,630,988 B2 | 10/2003 | Greene, Jr. et al. |
| 6,646,662 B1 | 11/2003 | Nebashi et al. |
| 6,662,725 B1 | 12/2003 | Koizumi et al. |
| 6,678,038 B2 | 1/2004 | Binnard |
| 6,696,220 B2 | 2/2004 | Bailey et al. |
| 6,713,238 B1 | 3/2004 | Chou et al. |
| 6,716,754 B2 | 4/2004 | Hofmann et al. |
| 6,776,094 B1 | 8/2004 | Whitesides et al. |
| 6,805,054 B1 * | 10/2004 | Meissl et al. ............... 101/483 |
| 6,809,356 B2 | 10/2004 | Chou |
| 6,828,244 B2 | 12/2004 | Chou |
| 6,842,221 B1 * | 1/2005 | Shiraishi .................... 355/30 |
| 6,849,558 B2 | 2/2005 | Schaper |
| 6,873,087 B1 | 3/2005 | Choi et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,946,360 B2 | 9/2005 | Chou |
| 6,955,767 B2 | 10/2005 | Chen |
| 6,964,793 B2 | 11/2005 | Willson et al. |
| 7,070,405 B2 | 7/2006 | Sreenivasan et al. |
| 7,077,992 B2 | 7/2006 | Sreenivasan et al. |
| 7,117,583 B2 | 10/2006 | Dinan et al. |
| 7,128,875 B2 | 10/2006 | Cubicciotti |
| 7,259,102 B2 | 8/2007 | Wang et al. |
| 7,423,733 B2 * | 9/2008 | Van De Ven et al. .......... 355/75 |
| 2002/0042027 A1 | 4/2002 | Chou et al. |
| 2002/0132482 A1 | 9/2002 | Chou |
| 2002/0150398 A1 | 10/2002 | Choi et al. |
| 2002/0167117 A1 | 11/2002 | Chou |
| 2002/0168578 A1 | 11/2002 | Wang et al. |
| 2002/0170880 A1 | 11/2002 | Chen |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0137494 A1 | 7/2003 | Tulbert |
| 2003/0174435 A1 | 9/2003 | Dinan et al. |
| 2003/0186140 A1 | 10/2003 | Fries |
| 2003/0224295 A1 | 12/2003 | Heerens et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0250945 A1 | 12/2004 | Zheng et al. |
| 2005/0037143 A1 | 2/2005 | Chou et al. |
| 2005/0113484 A1 | 5/2005 | Kamen et al. |
| 2005/0281638 A1 | 12/2005 | Kuipers et al. |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2007/0064384 A1 | 3/2007 | Schumaker et al. |
| 2007/0074635 A1 | 4/2007 | Schumaker et al. |
| 2009/0030547 A1 | 1/2009 | Rice et al. |

FOREIGN PATENT DOCUMENTS

| | | |
|---|---|---|
| JP | 1-196749 | 8/1989 |
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/33232 | 5/2001 |
| WO | WO 01/47003 | 6/2001 |
| WO | WO 2004/103666 A2 | 12/2004 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Chou et al., Ultrafast and Direct Imprint of Nanostructures in Silicon, Nature, col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Colburn et al., Dissertation for the Degree of Doctor of Philosophy, Step and Flash Imprint Lithography: A Low-Pressure, Room-Temperature Nanoimprint Lithography Aug. 1, 2001.

Abstract of Japanese patent 02-192045, Jul. 27, 1990.

U.S. Appl. No. 11/211,785, Schumaker et al. entitled System to Couple a Body and a Docking Plate, filed Aug. 25, 2005.

U.S. Appl. No. 11/211,763, Schumaker et al. entitled Method to Transfer a Template Transfer Body Between a Motion Stage and a Docking Plate, filed Aug. 25, 2005.

Kim et al., High-precision Magnetic Levitation Stage for Photolithography, Precision Engineering. vol. 22. No. 2, pp. 66-77 Apr. 1, 1998.

Lee et al., Ultraprecision Stage for Alignment of Wafers in Advanced Microlithography, Precision Engineering, pp. 113-122 Sep. 1, 1997.

Williams et al., Magnetic Levitation Scanning Stage for Extreme Ultraviolet Lithography, American Society for Precision Engineering, vol. 20, pp. 583-586 Nov. 1, 1999.

Choi et al., Partially Contstrained Compliant Stages for High Resolution Imprint Lithography, 2000 Proceedings of the ASME 2000 Design Engineering Technical Conference, DETC2000/MECH-4145, Baltimore, Maryland. Sep. 10, 2000.

Huang et al., Reversal Imprinting by Transferring Polymer from Mold to Substrate, J. Vac. Sc. Technol. B 20(6); pp. 2872-2876 Nov. 1, 2002.

* cited by examiner

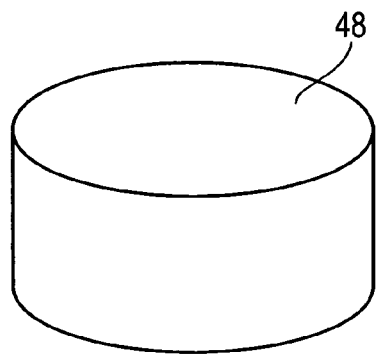
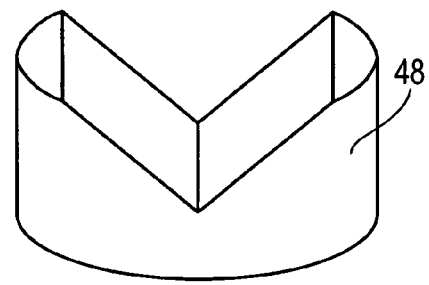
*FIG. 2*  *FIG. 3*
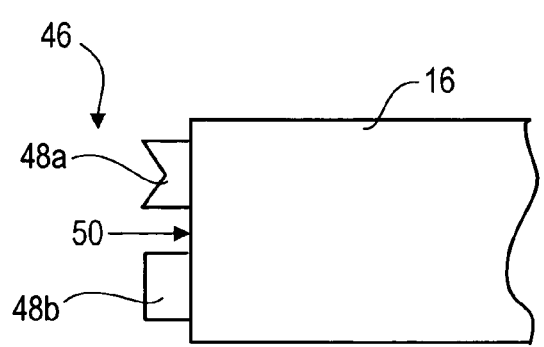
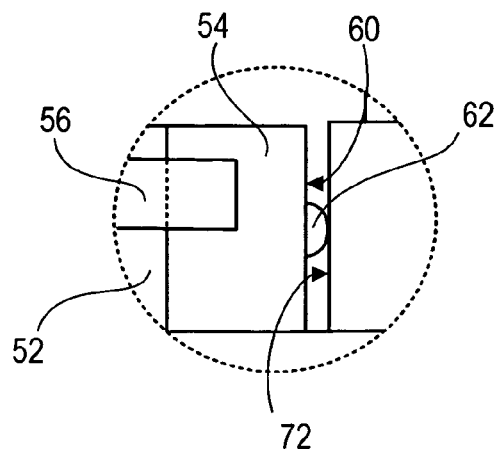
*FIG. 4*  *FIG. 5*

SYSTEM TO TRANSFER A TEMPLATE TRANSFER BODY BETWEEN A MOTION STAGE AND A DOCKING PLATE

CROSS-REFERENCE TO RELATED PATENT APPLICATIONS

The present application is related in subject matter to U.S. patent application Ser. No. 11/211,763 entitled "Method to Transfer a Template Transfer Body Between a Motion Stage and a Docking Plate," and listing Philip D. Schumaker, Angelo Fancello, Jae H. Kim, Byung-Jin Choi and Daniel A. Babbs as inventors; and is related in subject matter to U.S. patent application Ser. No. 11/211,785 entitled "System to Couple a Body and a Docking Plate," and listing Philip D. Schumaker, Angelo Fancello, Jae H. Kim, Byung-Jin Choi and Daniel A. Babbs as inventors, the entirety of which are incorporated by reference herein.

BACKGROUND OF THE INVENTION

The field of the invention relates generally to nano-fabrication of structures. More particularly, the present invention is directed to a system to transfer a body between a motion stage and a docking system.

Nano-fabrication involves the fabrication of very small structures, e.g., having features on the order of nano-meters or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology., mechanical systems and the like.

An exemplary nano-fabrication technique is commonly referred to as imprint lithography. Exemplary imprint lithography processes are described in detail in numerous publications, such as U.S. published patent application 2004/0065976 filed as U.S. patent application Ser. No. 10/264,960, entitled, "Method and a Mold to Arrange Features on a Substrate to Replicate Features having Minimal Dimensional Variability"; U.S. published patent application 2004/0065252 filed as U.S. patent application Ser. No. 10/264,926, entitled "Method of Forming a Layer on a Substrate to Facilitate Fabrication of Metrology Standards"; and U.S. published patent application 2004/0046271 filed as U.S. patent application Ser. No. 10/235,314, (U.S. Pat. No. 6,936,194) entitled "Functional Patterning Material for Imprint Lithography Processes," all of which are assigned to the assignee of the present invention.

The fundamental imprint lithography technique disclosed in each of the aforementioned United States published patent applications includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

Imprint lithography systems often use an imprint head with the template, which can be installed and removed from the imprint head. This allows the imprint lithography system to be used to imprint different patterns. In this manner, the imprint lithography system may be used to fabricate various types of circuits or other devices, or imprint various structures on a substrate.

U.S. Pat. No. 6,805,054 to Meissl et al., which is assigned to the assignee of the present invention, describes a template transfer system having a template positioned thereupon, wherein relative movement is created between the motion stage and the imprint head to place the template transfer system and the imprint head in superimposition to transfer the template to the imprint head.

To that end, it may be desired to provide an improved system of storing the template.

SUMMARY OF THE INVENTION

The present is directed towards an imprint lithography system including, inter alia, a docking plate; a motion stage having a range of motion associated therewith, the range of motion having a periphery spaced-apart from the docking plate a first distance; and a body, having first and second opposed sides spaced-apart a second distance, selectively coupled between the docking plate and the motion stage, the first distance being greater than the second distance to minimize, if not prevent, a probability of a collision between the docking plate, the motion stage and the body while transferring the body between the docking plate and the motion stage. These and other embodiments are described fully below.

BRIEF DESCRIPTION OF THE DRAWINGS

FIG. 2 is a perspective view of a first embodiment of a coupling mechanism of the motion stage shown in FIG. 1;

FIG. 3 is a perspective view of a second embodiment of a coupling mechanism of the motion stage shown in FIG. 1; and FIG. 4 is a top-down view of the motion stage shown in FIG. 1;

FIG. 5 is a detailed view of the interface between the template transfer system and the docking system shown in FIG. 1;

DETAILED DESCRIPTION OF THE INVENTION

Figure 1:
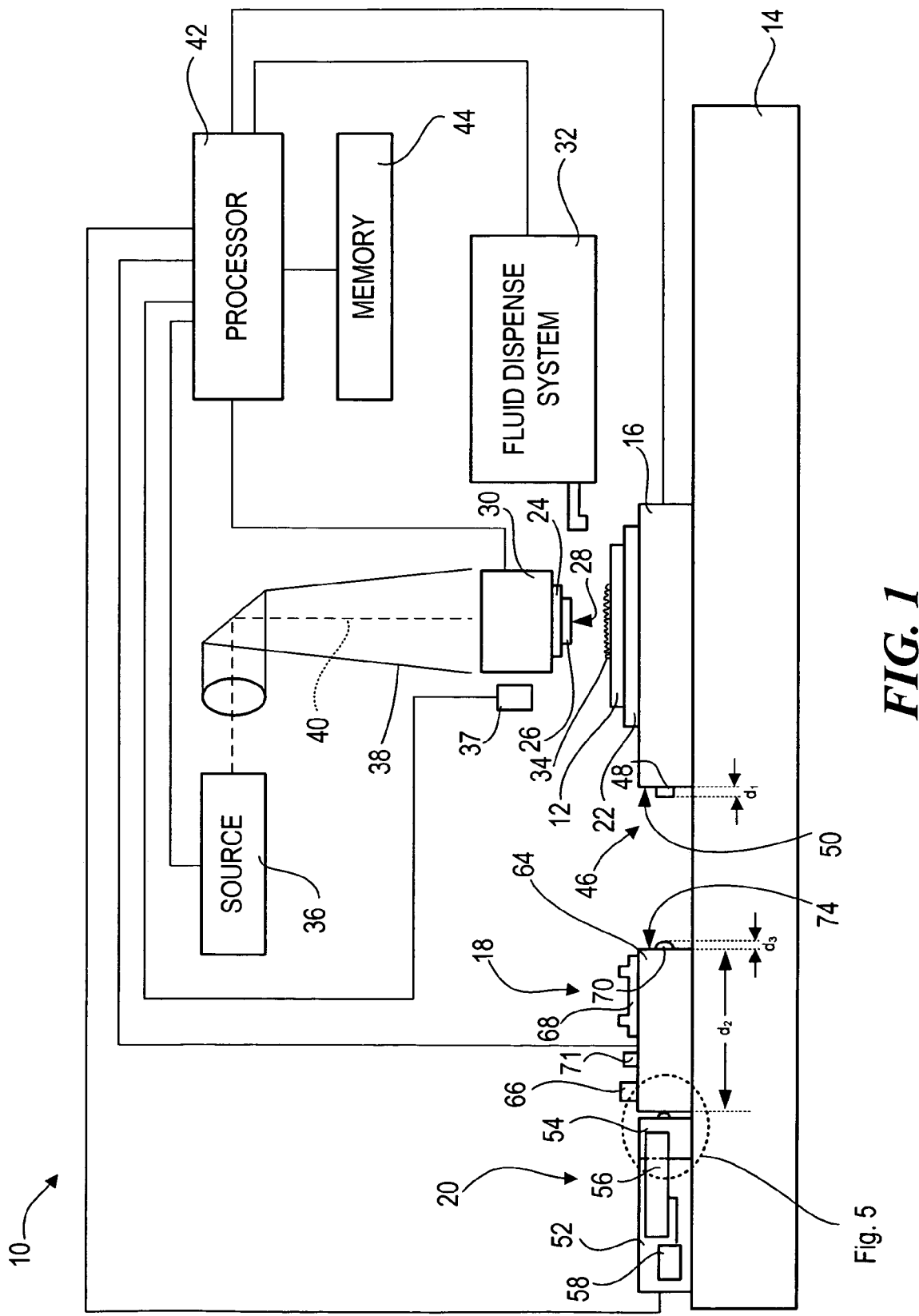
FIG. 1 is a side view of a lithography system having a template transfer system, a docking system, and a motion stage positioned thereon.

Referring to FIG. 1, a system 10 to form a relief pattern in a substrate 12 includes a stage support 14 having a motion stage 16, a template transfer system 18, and a docking system 20 positioned thereon, with template transfer system 18 being positioned between motion stage 16 and docking system 20. As shown, template transfer system 18 is coupled to docking system 20. However, template transfer system 18 may be coupled to motion stage 16, described further below.

Motion stage 16 holds substrate 12 on a chuck 22, with chuck 22 being any chuck including, but not limited to, vacuum and electromagnetic. Spaced-apart from stage support 14 is a template 24 having a mold 26 with a patterning surface 28 thereon. Patterning surface 28 may be substantially smooth and/or planar, or may be patterned so that one or more recesses are formed therein. Template 24 is coupled to an imprint head 30 to facilitate movement of template 24. A fluid dispense system 32 is coupled to be selectively placed in fluid communication with substrate 12 so as to deposit a polymerizable material 34 thereon. In a further embodiment, fluid dispense system 32 may be coupled to template transfer system 18. A source 36 of energy 38 is coupled to direct energy 38 along a path 40. Imprint head 30 and motion stage 16 are configured to arrange mold 26 and substrate 12, respectively, to be in superimposition, and disposed in path 40. An optical system 37 may facilitate obtaining a desired alignment of mold 26 and substrate 12, described further below. Either imprint head 30, motion stage 16, or both vary a distance between mold 26 and substrate 12 to define a desired volume therebetween that is filled by polymerizable material 34.

Typically, polymerizable material 34 is disposed upon substrate 12 before the desired volume is defined between mold 26 and substrate 12. However, polymerizable material 34 may fill the volume after the desired volume has been obtained. After the desired volume is filled with polymerizable material 34, source 36 produces energy 38, which causes polymerizable material 34 to solidify and/or cross-link, forming polymeric material conforming to the shape of the patterning surface 28. Control of this process is regulated by a processor 42 that is in data communication with motion stage 16, imprint head 30, fluid dispense system 32, source 36, and optical system 37 operating on a computer readable program stored in a memory 44.

Motion stage 16 comprises a coupling system 46 to facilitate coupling with template transfer system 18, described further below. Coupling system 46 comprises a coupling element 48 positioned on a side 50 of motion stage 16, with side 50 facing template transfer system 18. Coupling element 48 may extend a distance '$d_1$' from side 50 and may have a geometrical shape selected from a flat plane, as shown in FIG. 2, or a vee, as shown in FIG. 3. The selection of the type of coupling design for coupling element 48 is known to one skilled in the art and typically depends on the specific application which is desired. In a further embodiment, coupling system 46 may comprise a plurality of coupling elements 48, with the plurality of coupling elements 48 comprising any combination of the above-mentioned geometrical shapes. In a preferred embodiment, coupling system 46 comprises a pair of coupling elements 48a and 48b, as shown in FIG. 4, with coupling element 48a having a vee geometrical shape and coupling element 48b having a flat plane geometrical shape.

Motion stage 16 may comprise a plurality of air bearings (not shown) positioned between motion stage 16 and stage support 14. The air bearings (not shown) allow frictionless motion of the same about stage support 14. As mentioned above, motion stage 16 may be in data communication with processor 42 operating on a computer readable program stored in memory 44 to regulate a motion thereof.

Referring to FIGS. 1 and 5, docking system 20 comprises a docking body 52 coupled to a docking plate 54 by an arm 56. Arm 56 may be in communication with a motor 58. In a preferred embodiment, motor 58 may be a pneumatic actuator. Motor 58 translates arm 56 to place docking plate 54 in a desired position with respect to docking body 52. Positioned on a side 60 of docking plate 54 is a protrusion 62. Protrusion 62 may be employed to facilitate coupling of docking system 20 with template transfer system 18, described further below. Furthermore, docking system 20 may be in data communication with processor 42 operating on a computer readable program stored in memory 44 to regulate a motion thereof.

Template transfer system 18 comprises a body 64 having an optical detection system 66, a template holder 68, and a coupling means 70 positioned thereon. In a further embodiment, body 64 may comprise a component 71, wherein component 71 may be any device that may interact with motion stage 16, template transfer system 18, docking system 20, imprint head 30, or any part of system 10 to produce a desired result. Body 64 has a first side 72 and a second side 74, with first and second sides 72 and 74 being spaced-apart a distance '$d_2$'. First side 72 faces docking system 20 and second side 74 faces motion stage 16. Coupling means 70 may extend a distance '$d_3$' from second side 74. Optical detection system 66 may comprise a microscope in optical communication with a camera. Coupling means 70 facilitates coupling of template transfer system 18 to motion stage 16, described further below. As shown, coupling means 70 has a spherical geometry. However, in a further embodiment, coupling means 70 may have any geometry desired to facilitate coupling of template transfer system 18 to motion stage 16.

Template transfer system 18 may further comprise a plurality of air bearings (not shown) to allow frictionless motion of the same about stage support 14. The plurality of air bearings (not shown) may be the same as those mentioned-above with respect to motion stage 16.

Figure 6:
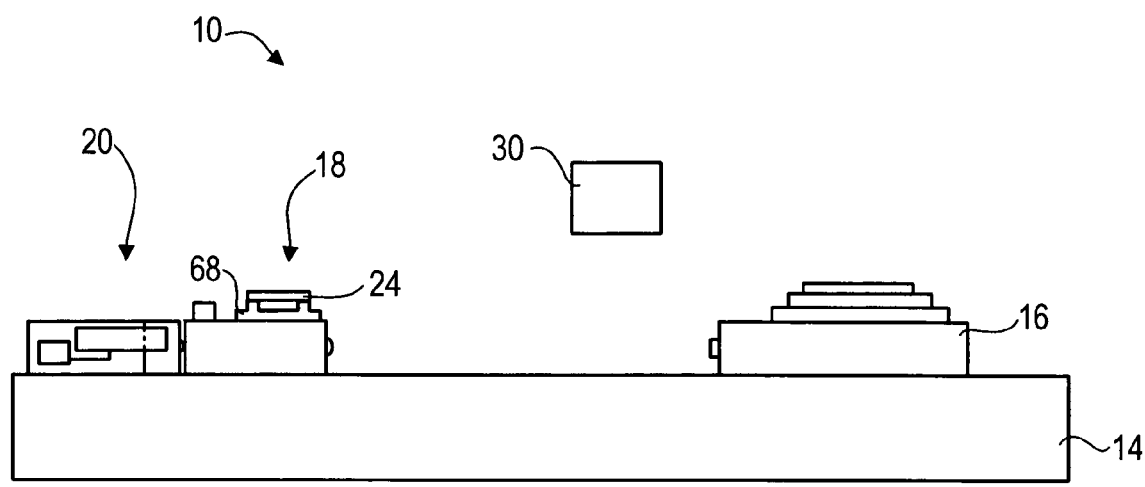
FIG. 6 is a simplified side view of the system shown in FIG. 1, with a template positioned on the template transfer system.

Referring to FIG. 6, shown is a simplified side view of a portion of system 10, shown in FIG. 1. Template 24 may be removable from imprint head 30 of system 10, and thus, another template may then be installed in imprint head 30. For example, if template 24 wears out or is damaged, a replacement template may be installed, or a template with a different mold (i.e. structure or pattern) may be installed to imprint a different structure. To that end, template 24 may be stored on template transfer system 18. More specifically, template 24 may be supported on template holder 68 of template transfer system 18 by a gas film, the gas film preventing contact between template 24 and template holder 68.

Figure 7:
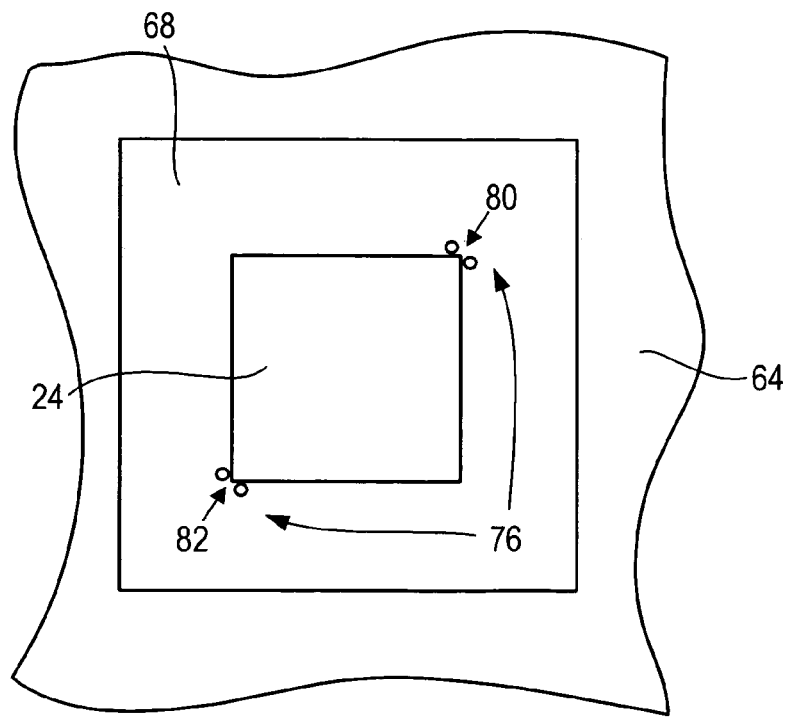
FIG. 7 is a top-down view of the template transfer system shown in FIG. 1.

Referring to FIG. 7, template holder 68 may comprise pins 76 having a first set 80 and a second set 82. First set 80 and second set 82 may be spaced-apart diagonally from one another. Pins 76 facilitate a self aligning motion of template 24. More specifically, one set of first set 80 and second set 82 may be stationary while the remaining set of first set 80 and second set 82 may be moveable with respect to the stationary set of first set 80 and second set 82. The stationary set of first set 80 and second set 82 provides a reference location upon template holder 68 to facilitate positioning of template 24 thereupon. The moveable set of first set 80 and second set 82 may exert a force upon template 24 such that template 24 contacts the stationary set of first set 80 and second set 82. As shown, each of first and second sets 80 and 82 each comprise two pins. However, in a further embodiment, each of first and second sets 80 and 82 may comprise any desired amount of pins to facilitate orientation of template 24 with respect to template holder 68.

Figure 8:
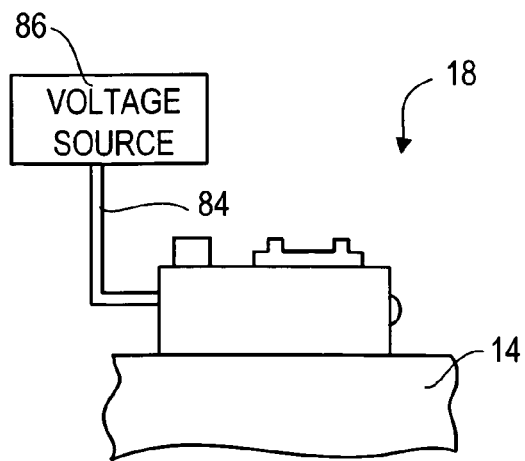
FIG. 8 is a side view of the template transfer system shown in FIG. 1, in electrical communication with a voltage source.
Figure 9:
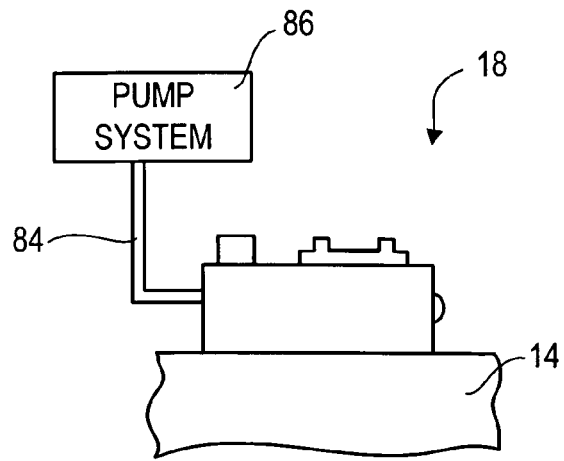
FIG. 9 is a side view of the template transfer system shown in FIG. 1, in fluid communication with a pump system.

Referring to FIGS. 6, 8, and 9, template transfer system 18 is coupled to docking system 20. To that end, template transfer system 18 comprises a cord 84 placing template transfer system 18 in communication with a coupling source 86. In a first example, coupling source 86 comprises a voltage source, as shown in FIG. 8. As a result, an electric field may be created between template transfer system 18 and docking system 20 to couple template transfer system 18 to docking system 20. In a second example, coupling source 86 comprises a pump system, as shown in FIG. 9. As a result, a vacuum may be created between template transfer system 18 and docking system 20 to couple template transfer system 18 to docking system 20. In a further embodiment, cord 84 may also place template transfer system 18 in electrical communication with a power source (not shown). Control of coupling of template transfer system 18 may be regulated by processor 42, shown in FIG. 1, that is data communication with template transfer system 18 and coupling source 86 operating on a computer readable program stored in memory 44, shown in FIG. 1.

Referring to FIG. 6, to transfer template 24 from template transfer system 18 to imprint head 30, template 24 may be positioned into a close proximity to imprint head 30 such that template 24 may be secured to imprint head 30 by vacuum and/or mechanical contact. To that end, template transfer system 18 may be coupled to motion stage 16 to position template 24 in a close proximity to imprint head 30.

To transfer template transfer system 18 from docking system 20 to motion stage 16, motion stage 16 is translated such that the same is in a close proximity to template transfer system 18. However, it is desired to minimize, if not prevent, a probability of a collision between template transfer system 18 and motion stage 16 while translating motion stage 16. A collision between template transfer system 18 and motion stage 16 while translating motion stage 16 may result in, inter alia, structural comprise in system 10, misalignment of template transfer system 18 with respect to motion stage 16, and damage to template 24 and/or substrate 12, shown in FIG. 1, all of which are undesirable. To that end, a system and method to minimize, if not prevent, a probability of a collision between template transfer system 18 and motion stage 16 is described below.

Figure 10:
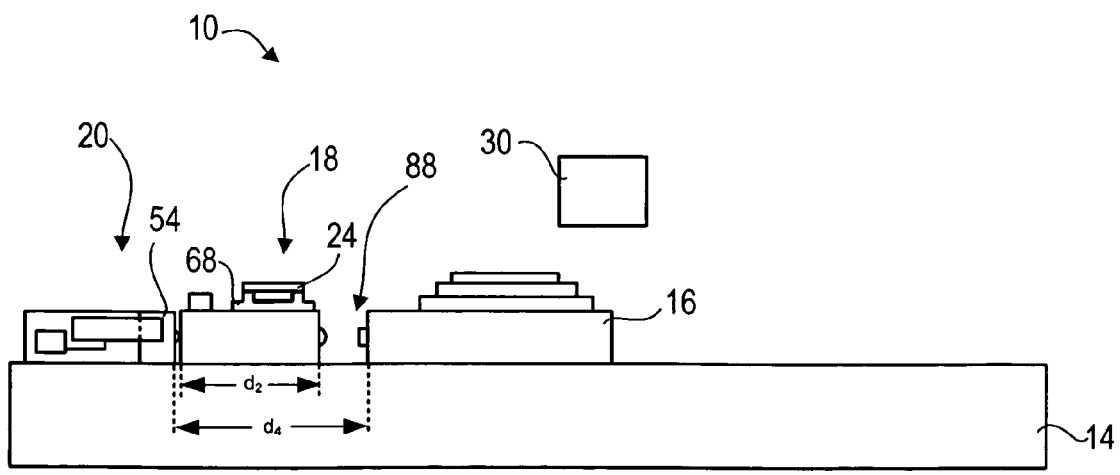
FIG. 10 is a side view of the lithographic system, shown in FIG. 1, with the motion stage positioned proximate to the template transfer system.

Referring to FIG. 10, to transfer template transfer system 18 from docking system 20 to motion stage 16, motion stage 16 is positioned proximate to template transfer system 18. To that end, motion stage 16 has a range of motion associated therewith, i.e., a distance through which motion stage 16 may translate about stage support 14. The range of motion of motion stage 16 has a periphery associated therewith, i.e., a maximum amount of distance motion stage 16 may translate about stage support 14. To that end, motion stage 16 is translated to be spaced-apart a distance '$d_4$' from surface 60, shown in FIG. 5, of docking plate 54, with distance '$d_4$' being at the periphery of the range of motion of motion stage 16. Distance '$d_4$' is greater than distance '$d2$' and thus, motion stage 16 is spaced-apart from template transfer system 18 defining a gap 88 therebetween. In a further embodiment, distance '$d4$' may be greater than the sum of distances '$d_1$', '$d_2$' and '$d_3$', shown in FIG. 1. Further, gap 88 may be greater than the sum of distances '$d_3$' and '$d_1$', shown in FIG. 1. As a result, motion stage 16 may be brought into a close proximity to template transfer system 18 while minimizing, if not preventing, a probability of a collision between motion stage 16 and template transfer system 18 while translating motion stage 16.

Figure 11:
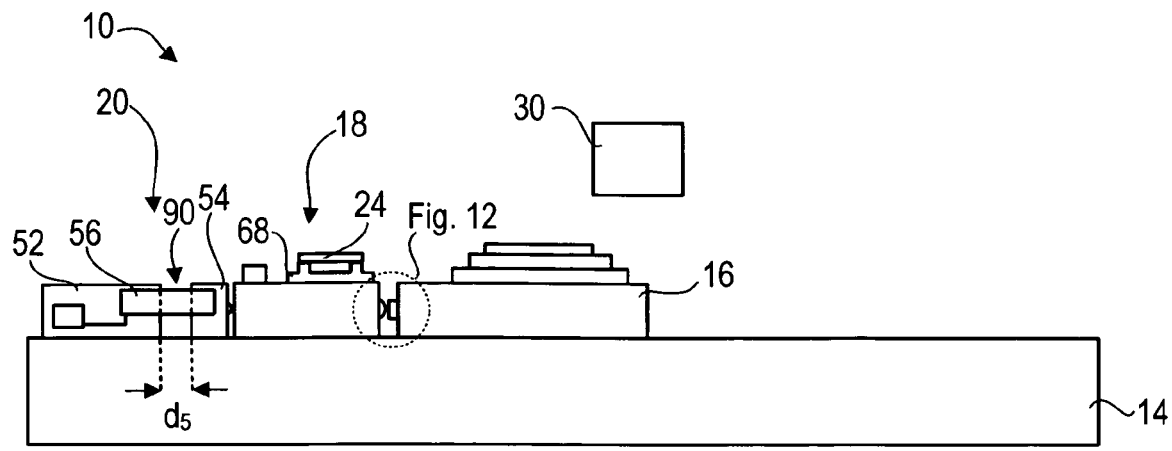
FIG. 11 is a side view of the lithographic system, shown in FIG. 1, with the docking system positioning the template transfer system to be in contact with the motion stage.
Figure 12:
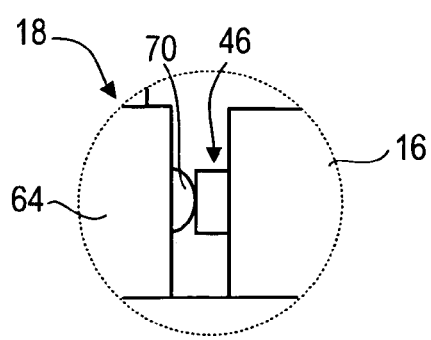
FIG. 12 is a detailed view of the interface between the template transfer system and the motion stage shown in FIG. 11.

Referring to FIGS. 11 and 12, after positioning motion stage 16 distance '$d_4$,' shown in FIG. 10, from surface 60, shown in FIG. 5, of docking plate 54, docking system 20 may position template transfer system 18 to be in contact with motion stage 16. More specifically, arm 56 creates a gap 90 between docking body 52 and docking plate 54, with docking plate 54 being positioned a distance '$d_5$' from docking body 52. Creation of gap 90 by arm 56 may be controlled by a force-controlled method wherein transmission of excessive force to motion stage 16 is minimized, if not prevented.

To that end, as a result of creation of gap 90, template transfer system 18 may be positioned to be in contact with motion stage 16. In a further embodiment, template transfer system 18 may be positioned in contact with motion stage 16 without causing translational motion of motion stage 16. Template transfer system 18 may then be transferred from docking system 20 to motion stage 16 by coupling template transfer system 18 to motion stage 16 and decoupling template transfer system 18 from docking system 20.

Specifically, coupling system 46 of motion stage 16 is brought into contact with coupling means 70 of template transfer system 18 to mate coupling system 46 with coupling means 70 to form a point of contact therebetween. Movement of template transfer system 18 may be constrained along a plurality of degrees of freedom depending on a type of coupling design employed for coupling system 46.

Further, to transfer template transfer system 18 from docking system 20 to motion stage 16, template transfer system 18 is decoupled from docking system 20 and coupled to motion stage 16. In a first example, to couple template transfer system 18 to motion stage 16, coupling source 86, shown in FIG. 8, creates an electric field therebetween, and in a second example, coupling source 86, shown in FIG. 10, creates a vacuum therebetween.

Figure 13:
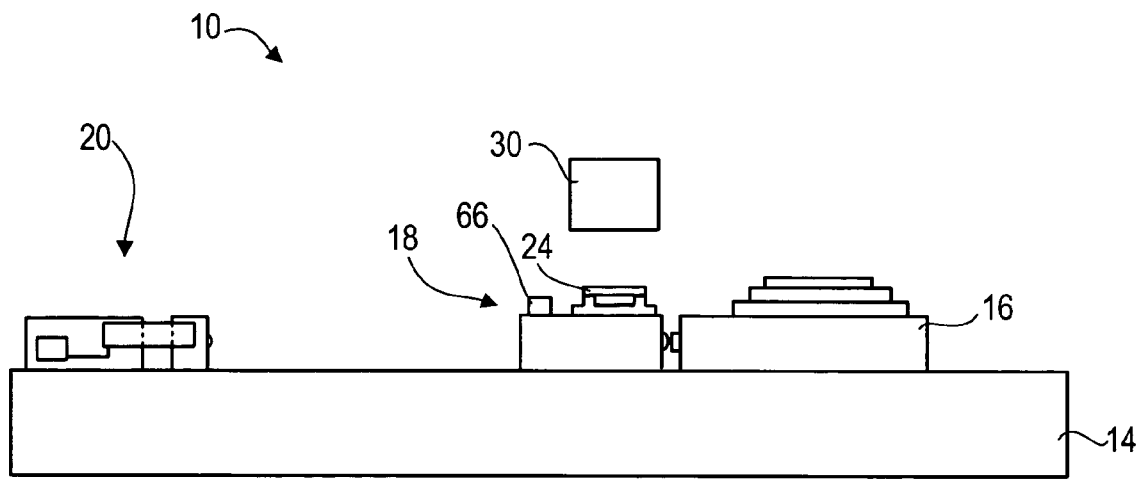
FIG. 13 is a side view of the lithographic system shown in FIG. 1, with the template transfer system coupled to the motion stage.

Referring to FIG. 13, after transferring template transfer system 18 from docking system 20 to motion stage 16 and coupling template transfer system 18 to motion stage 16, template transfer system 18 may be translated about stage support 14 via motion stage 16. More specifically, template transfer system 18 may be translated about stage support 14 to position template transfer system 18 in a desired position upon stage support 14 to facilitate coupling of template 24 to imprint head 30. Optical detection system 66 may be employed in conjunction with optical system 37, shown in FIG. 1, to determine a presence and/or a position of template and/or template transfer system 18 with respect to imprint head 30. Template 24 may then be coupled to imprint head 30, with imprint head 30 having vacuum and/or mechanical retention means for holding template 24, which are omitted for simplicity of illustration.

Figure 14:
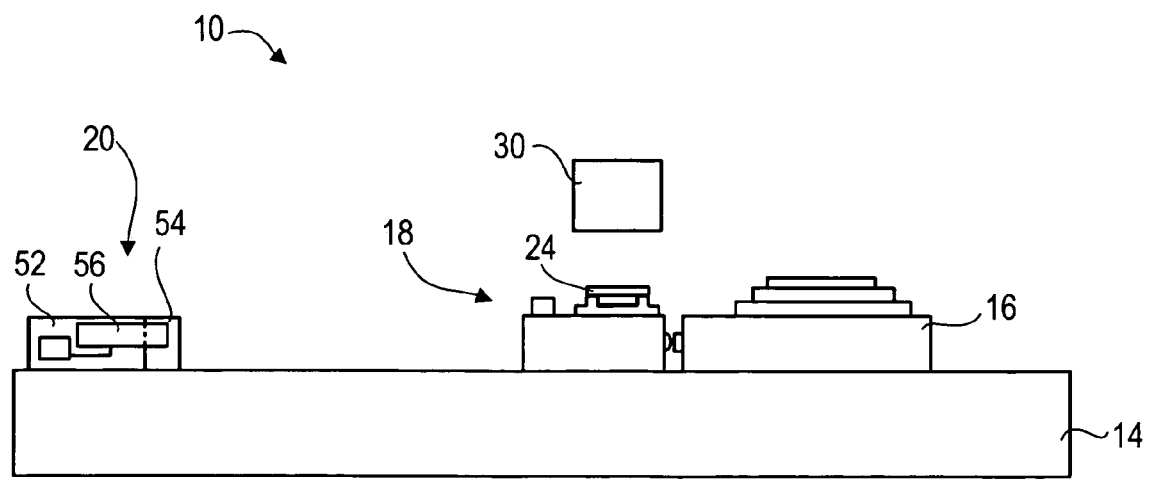
FIG. 14 is a side view of the lithography system shown in FIG. 1, with an arm of the docking system being retracted.

Referring to FIG. 14, after achieving the desired position of template transfer system 18 upon stage support 14, arm 56 of docking system 20 may be subsequently retracted such that docking plate 54 is positioned adjacent to docking body 52. However, in a further embodiment, arm 56 may be retracted concurrently during positioning of template transfer system 18. In a further embodiment, the above-mentioned system and method of transferring template transfer system 18 between docking system 20 and motion stage 16 may be implemented with template transfer system 18 absent of template 24. In a further embodiment, a second motion stage (not shown) differing from motion stage 16 may be employed to obtain a desired position of template transfer system 18 upon stage support 14.

After coupling template 24 to imprint head 30, template transfer system 18 may be transferred from motion stage 16 to docking system 20 by employing the above-mentioned process implemented in reverse. As a result, a probability of a collision between template transfer system 18 and docking system 20 while translating motion stage 16 may be minimized, if not prevented, which may be desired. Furthermore, transferring template transfer system 18 from motion stage 16 to docking system 20 minimizes a total mass that motion stage 16 may translate. Minimizing the total mass motion stage 16 may translate, and further, minimizing the inertial forces upon motion stage 16, may result in, inter alia, improving a positioning precession of motion stage 16, increasing a maximum velocity of motion stage 16, increasing a maximum acceleration of motion stage 16, and reducing step and settling times of motion stage 16.

Referring to FIG. 1, it may also be desired to minimize a kinetic energy present during a collision between template transfer system 18 and motion stage 16 while translating motion stage 16. As mentioned above, a collision between template transfer system 18 and motion stage 16 may result in, inter alia, structural compromise in system 10, misalignment of template transfer system 18 with respect to motion stage 16, and damage to template 24 and/or substrate 12, all of which are undesirable. To that end, minimizing the kinetic energy present during the collision between template transfer system 18 and motion stage 16 while translating motion stage 16 may minimize, if not prevent, the above-mentioned effects.

As mentioned above, to transfer template transfer system 18 from docking system 20 to motion stage 16, motion stage 16 is positioned proximate to template transfer system 18 defining gap 88, shown in FIG. 10, therebetween. Docking system 20 then positions template transfer system 18 to be in contact with motion stage 16. To that end, during transfer of template transfer system 18 between docking system 20 and motion stage 16, motion of template transfer system 18 and motion stage 16 occurs asynchronously. More specifically, translation of docking system 20 to place template transfer system 18 in contact with motion stage 16, as mentioned above, does not occur until translation of motion stage 16 has ceased. As a result, only one of template transfer system 18 and motion stage 16 is moving at a time. As a result, the total kinetic energy of system 10 during translation of motion stage 16 may be reduced, which may be desired. Furthermore, as mentioned above, minimizing the total mass motion stage 16 may translate may reduce the total kinetic energy of system 10.

Figure 15:
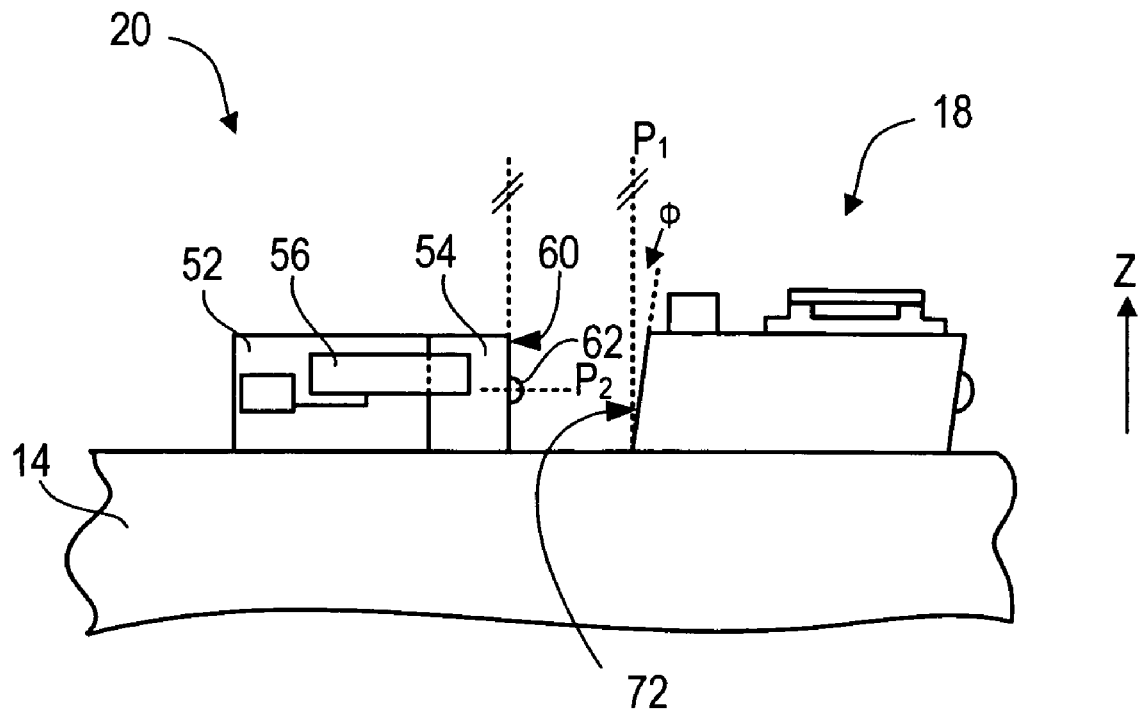
FIG. 15 is a side view of the lithographic system shown in FIG. 1, with the template transfer system having an orientation error.

Referring to FIG. 15, it may also be desired to control an orientation of template transfer system 18 with respect to docking system 20 to facilitate coupling of template transfer system 18 and docking system 20. More specifically, in the presence of an orientation error of template transfer system 18 with respect to docking system 20, it may be desired to maintain the orientation error of template transfer system 18 with respect to docking system 20 to minimize, if not prevent, motion of template transfer system 18 about the Z-axis. In the present example, the orientation error may be shown as first side 72 of template transfer system 18 forming an angle $\Phi$ with respect to a plane $P_1$ parallel to surface 60 of docking system 20.

Figure 16:
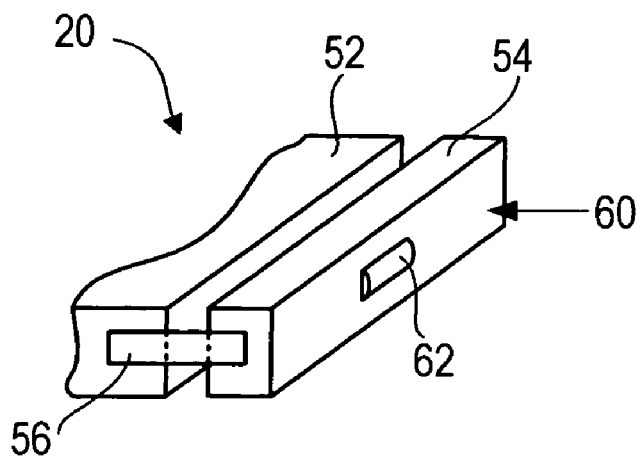
FIG. 16 is a perspective view of the docking system shown in FIG. 1, having a protrusion positioned thereon.
Figure 17:
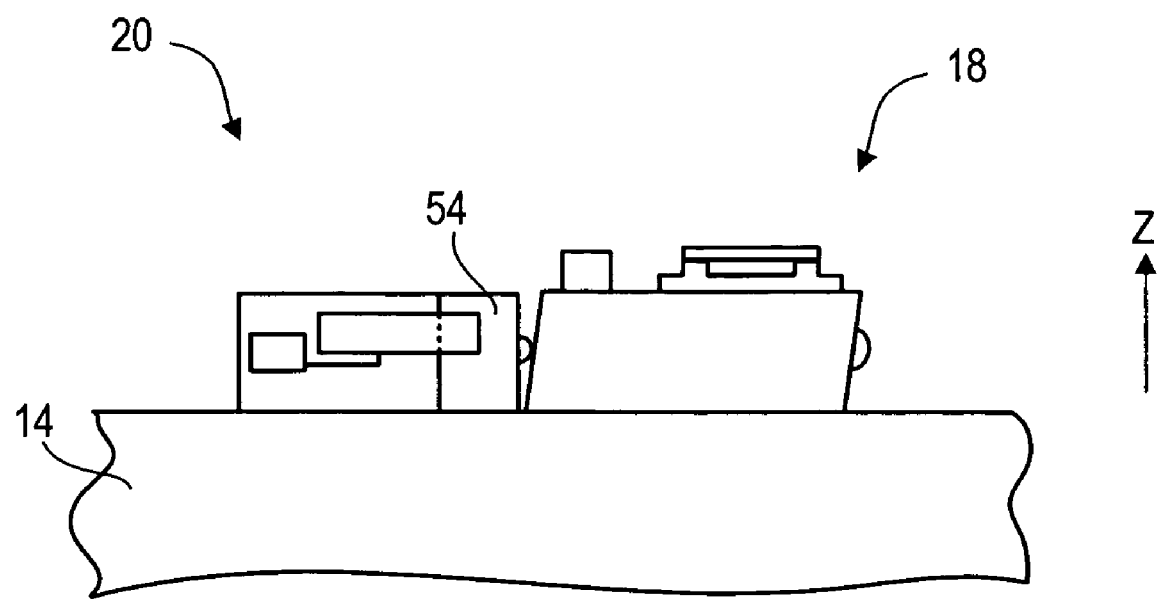
FIG. 17 is a side view of the lithographic system shown in FIG. 1, with the template transfer system, having an orientation error, coupled to the docking system.

Referring to FIGS. 15 and 16, to that end, to maintain the orientation error of template transfer system 18 with respect to docking system 20, docking plate 54 of docking system 20 comprises protrusion 62. Protrusion 62 controls a point/line contact between docking plate 54 and template transfer system 18. More specifically, when coupling template transfer system 18 to docking system 20, protrusion 62 minimizes, if not prevents, pivoting motion of template transfer system 18 with respect to docking system 20. As shown in FIG. 17, template transfer system 18 is coupled to docking system 20 while maintaining the orientation error.

Figure 18:
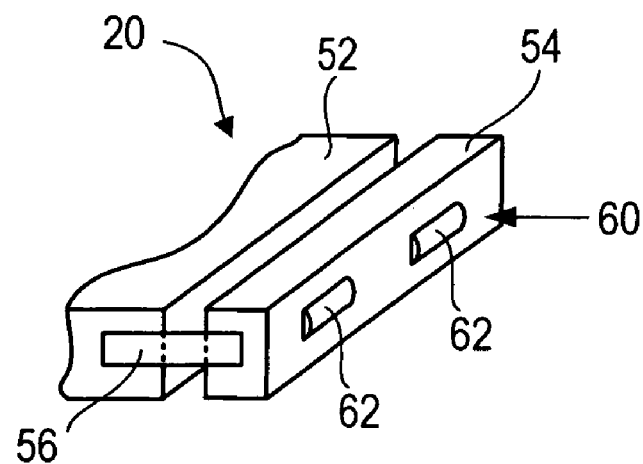
FIG. 18 is a perspective view of the docking system shown in FIG. 1, having a plurality of protrusions positioned thereon.

In a further embodiment, protrusion 62 may also minimize a probability, if not prevent, of a collision between template transfer system 18 and stage support 14 during coupling of template transfer system 18 and docking system 20. In still a further embodiment, protrusion 62 may also abrogate rotation of template transfer system 18 about the Z-axis, which may be desired. In a further embodiment, docking plate 54 may comprise a plurality of protrusions 62, as shown in FIG. 18.

Figure 19:
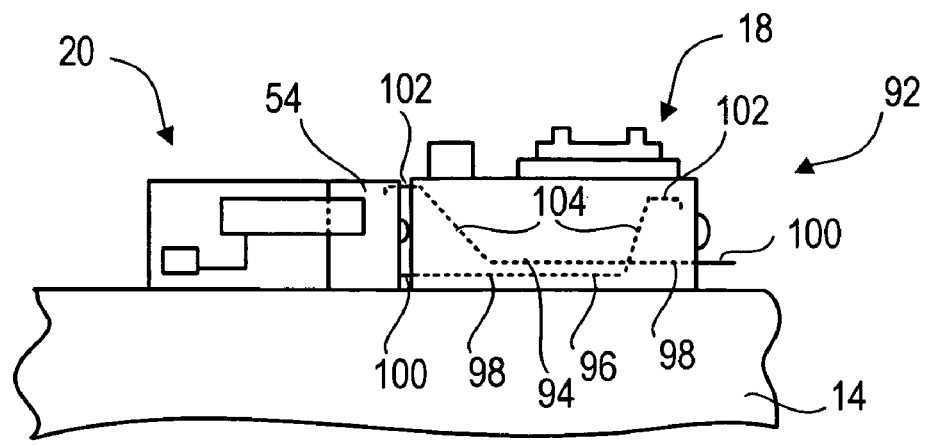
FIG. 19 is a side view of the lithographic system shown in FIG. 1, with the template transfer system having a latching system coupling the template transfer system to the docking system.
Figure 20:
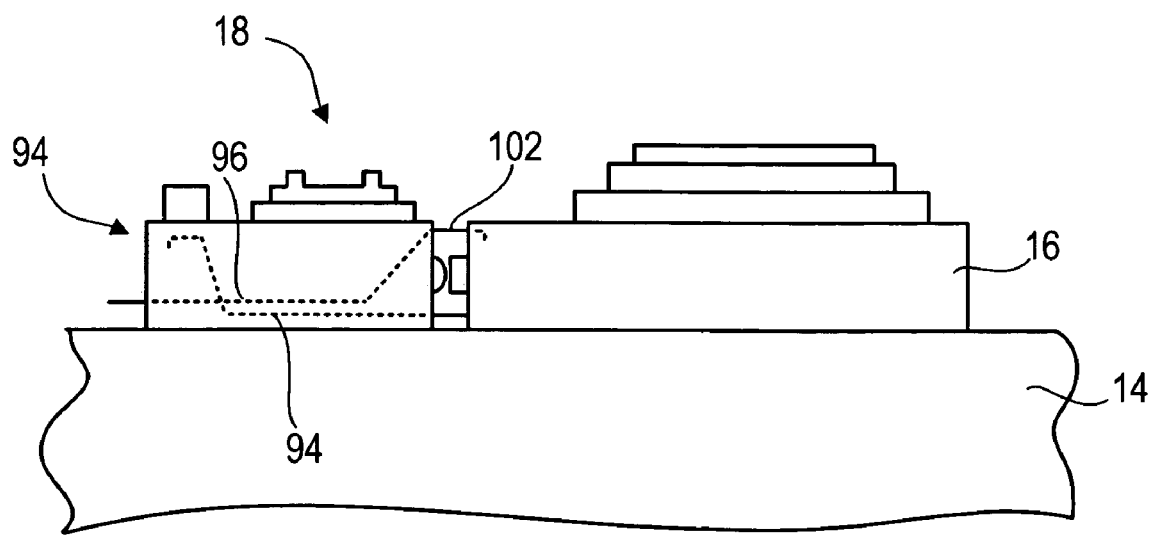
FIG. 20 is a side view of the lithographic system shown in FIG. 1, with the template transfer system having a latching system coupling the template transfer system to the motion stage.

Referring to FIGS. 19 and 20, template transfer system 18 may comprise a latching system 92. Latching system 92 comprises latches 94 and 96 that may mechanically couple template transfer system 18 to docking system 20 and motion stage 16, respectively. Latching system 92 may be implemented during, inter alia, power loss and/or vacuum loss of system 10, shown in FIG. 1. Latches 94 and 96 each comprise a shaft 98 having an end 100 and a coupling portion 102 having a pivot point 104. Latches 94 and 96 may each pivot about their respective pivot points 104. Ends 100 of latches 94 and 96 may extend beyond surfaces 72 and 74, shown in FIGS. 1 and 5, of template transfer system 18, respectively.

As shown in FIG. 19, latch 94 is placed in a first position and latch 96 is placed in a second position. As a result, latching portion 102 of latch 94 makes mechanical contact with docking plate 54 to couple template transfer body 20 to docking system 20. Furthermore, latch 96 is placed in the second position as a result of contact of end 100 of latch 96 with surface 60, shown in FIG. 5, of docking plate 54. More specifically, upon contact of end 100 of latch 96 with surface 60, shown in FIG. 5, of docking plate 54, shaft 98 translates such that latch 96 pivots about pivot point 104 placing latch 96 in the second position.

Referring to FIG. 20, in a further embodiment, latch 96 may be placed in the first position and latch 94 may be placed in the second position. As a result, latching portion 102 of latch 96 makes mechanical contact with motion stage 16 coupling template transfer system 20 to motion stage 16. Positioning of latch 94 in the second position may be analogous to positioning latch 96 in the second position, as mentioned above with respect to FIG. 19.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A transfer system of an imprint lithography system, the imprint lithography system operable for imprinting a pattern into a material deposited between an imprint template and a substrate, comprising:
    a docking system positioned on a stage support of the imprint lithography system;
    a motion stage having a substrate chuck for holding said substrate, said motion stage positioned on said stage support of said imprint lithography system and spaced-apart from said docking system a first distance, said motion stage having a range of motion associated therewith, with a periphery of said range of motion being spaced-apart from said docking system said first distance; and
    a body positioned on said stage support of said imprint lithography system, having first and second opposed sides spaced-apart a second distance, selectively coupled between said docking system and said motion stage, with said first distance being greater than said second distance to minimize a probability of a collision between any of said docking system, said motion stage, and said body while transferring said body between said docking system and said motion stage, said body having at least one component device positioned thereon.

2. The system as recited in claim 1 wherein said docking system comprises a docking body and a docking plate having an arm coupled therebetween, said arm being in communication with a motor to position said docking plate a third distance from said docking body, with said third distance being a difference between said first and second distances.

3. A transfer system of an imprint lithography system, said imprint lithography system operable for imprinting a pattern into a material deposited between an imprint template and a substrate comprising:
    a docking system, said docking system positioned on a stage support of said imprint lithography system;
    a motion stage positioned on said stage support of said imprint lithography system and spaced-apart from said docking system a first distance, said motion stage having a range of motion associated therewith, with a periphery of said range of motion being spaced-apart from said docking system said first distance; and
    a body positioned on said stage support of said imprint lithography system and having first and second opposed sides spaced-apart a second distance, selectively coupled between said docking system and said motion stage, with said first distance being greater than said second distance to minimize a probability of a collision between any of said docking system, said motion stage, and said body while transferring said body between said docking system and said motion stage, wherein said docking system comprises a docking body and a docking plate having an arm coupled therebetween, said arm having an additional range of motion associated therewith, with a periphery of said additional range of motion being spaced-apart from said docking system a third distance, with said third distance being a difference between said first and second distances.

4. The system as recited in claim 1 wherein said body comprises a latching system having first and second latches, wherein said first latch selectively couples said body to said docking system and said second latch selectively couples said body to said motion stage.

5. The system as recited in claim 1 wherein said system further includes a coupling source coupled to said body, with said coupling source selected from a group of coupling sources comprising a pump system and a voltage source.

6. The system as recited in claim 1 wherein said component device includes a template holder capable of holding said imprint lithography template.

7. The system as recited in claim 1 wherein said component device includes a detection system to determine a presence and a position of said imprint lithography template.

8. The system as recited in claim 1 wherein said motion stage comprises a coupling element selected from a group of coupling elements comprising a flat and a vee.

9. The system as recited in claim 1, wherein said body further includes a component that may interact with said docking system, said motion stage, or said body to produce a desired result.

10. A transfer system for use in an imprint lithography system, said imprint lithography system operable for imprinting a pattern into a material deposited between an imprint mold and a substrate comprising:
    a docking system positioned on a stage support;
    a motion stage positioned on said stage support and spaced-apart from said docking system a first distance, said motion stage having a range of motion associated therewith, with a periphery of said range of motion being spaced-apart from said docking system said first distance; and
    a body positioned on a stage support, having first and second opposed sides spaced-apart a second distance, selectively coupled between said docking system and said motion stage, with said first distance being greater than said second distance to minimize a kinetic energy present while transferring said body between said docking system and said motion stage, said body having at least one component device positioned thereon for use in said imprint lithography system.

11. The system as recited in claim 10 wherein said docking system comprises a docking body and a docking plate having an arm coupled therebetween, said arm being in communication with a motor to position said docking plate a third distance from said docking body, with said third distance being a difference between said first and second distances.

12. A transfer system of an imprint lithography system, said imprint lithography system operable for imprinting a pattern into a material deposited between an imprint template and a substrate comprising:
    a docking system, said docking system positioned on a stage support of said imprint lithography system;
    a motion stage positioned on said stage support of said imprint lithography system and spaced-apart from said docking system a first distance, said motion stage having a range of motion associated therewith, with a periphery of said range of motion being spaced-apart from said docking system said first distance; and
    a body positioned on said stage support of said imprint lithography system and having first and second opposed sides spaced-apart a second distance, selectively coupled between said docking system and said motion stage, with said first distance being greater than said second distance to minimize a kinetic energy present while transferring said body between said docking system and said motion stage, wherein said docking system comprises a docking body and a docking plate having an arm coupled therebetween, said arm having an additional range of motion associated therewith, with a periphery of said additional range of motion being spaced-apart from said docking system a third distance, with said third distance being a difference between said first and second distances.

13. The system as recited in claim 10 wherein said body comprises a latching system having first and second latches, wherein said first latch couples said body to said docking system and said second latch couples said body to said motion stage.

14. The system as recited in claim 10 wherein said system further includes a coupling source coupled to said body, with said coupling source selected from a group of coupling sources comprising a pump system and a voltage source.

15. The system as recited in claim 10 wherein said motion stage comprises a coupling element selected from a group of coupling elements comprising a flat and a vee.

16. An imprint lithography system comprising:
   a docking system positioned on a stage support, said docking system comprising a docking body and a docking plate having an arm coupled therebetween, said arm in communication with a motor to position said docking plate between first and second positions, said second position being spaced-apart from said docking body a first distance;
   a motion stage positioned on said stage support and spaced-apart from said docking system a second distance, said motion stage having a range of motion associated therewith, with a periphery of said range of motion being spaced-apart from said docking system said second distance; and
   a body positioned on said stags support and selectively coupled between said docking system and said motion stage, with said first and second distances being established to minimize a probability of a collision between any of said docking system, said motion stage and said body while transfening said body between said docking system and said motion stage, said body having a component device positioned thereon for use in said imprint lithography system.

17. The system as recited in claim 16 wherein said arm has an additional range of motion associated therewith, with a periphery of said additional range of motion being spaced-apart from said docking system said first distance.

18. The system as recited in claim 16 wherein said body comprises a latching system having first and second latches, wherein said first latch couples said body to said docking system and said second latch couples said body to said motion stage.

19. The system as recited in claim 16 wherein said system further includes a coupling source coupled to said body, with said coupling source selected from a group of coupling sources comprising a pump system and a voltage source.

20. The system as recited in claim 16 wherein said component device comprises a detection system to determine a presence and a position of a template.

21. The system recited in claim 16 wherein said motion stage comprises a coupling element selected from a group of coupling elements comprising a fiat and a vee.

22. The system as recited in claim 1 wherein the component device is an optical detection system.

23. The system as recited in claim 22 wherein said optical detection system includes a microscope and said optical detection system is capable of locating said imprint lithography template within said imprint lithography system.

* * * * *

UNITED STATES PATENT AND TRADEMARK OFFICE
CERTIFICATE OF CORRECTION

| | | |
|---|---|---|
| PATENT NO. | : 7,665,981 B2 | Page 1 of 1 |
| APPLICATION NO. | : 11/211766 | |
| DATED | : February 23, 2010 | |
| INVENTOR(S) | : Schumaker et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1154 days.

Signed and Sealed this

Twenty-sixth Day of October, 2010

David J. Kappos
*Director of the United States Patent and Trademark Office*